(12) United States Patent
Forohar et al.

(10) Patent No.: US 7,807,127 B1
(45) Date of Patent: Oct. 5, 2010

(54) FUNCTIONALIZATION OF CARBON NANOTUBES

(75) Inventors: Farhad Forohar, Laplata, MD (US);
Craig Whitaker, Annapolis, MD (US);
William M. Koppes, Adelphi, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 561 days.

(21) Appl. No.: 11/417,294

(22) Filed: Apr. 14, 2006

(51) Int. Cl.
*D01F 9/12* (2006.01)
(52) U.S. Cl. ............... 423/447.1; 423/447.2; 423/460; 977/745; 977/748
(58) Field of Classification Search .............. 423/447.1, 423/447.2, 460; 428/403, 407, 408; 977/745, 977/748
See application file for complete search history.

(56) References Cited

U.S. PATENT DOCUMENTS

| 6,872,681 | B2 | 3/2005 | Niu et al. |
| 6,875,412 | B2 | 4/2005 | Margrave et al. |
| 2004/0202603 | A1 | 10/2004 | Fischer et al. |
| 2004/0223900 | A1* | 11/2004 | Khabashesku et al. ... 423/447.1 |
| 2005/0214196 | A1 | 9/2005 | Ohashi et al. |
| 2005/0255030 | A1 | 11/2005 | Tour et al. |

OTHER PUBLICATIONS

E. Pretsch, P. Buhlmann, C. Affolter. Stucture Determination of Organic Compounds, Springer, 2000, p. 268-279.*
U.S. Appl. No. 11/417,292, filed Apr. 14, 2006, Forohar, et al.
U.S. Appl. No. 11/417,291, filed Apr. 14, 2005, Forohar, et al.
Long and Yang, "Carbon Nanotubes as a Superior Sorbent for Nitrogen Oxides", Ind. Eng. Chem Res. 2001, 40:4288-4291.
Ellison, et al., "Adsorption of NH3 and NO2 on Single-Walled Carbon Nanotubes", J.Phys. Chem. B. 2004, 108:7938-7943.
Gromov, et al., "Covalent Amino-Functionaliztion of Single Wall Carbn Nanotubes", J.Miller. Chem. 2005, 15:3334-3339.
Wang, et al., "Electrochemical Nitration of Single-Wall Carbon Nanotubes", Chem. Phys. Lett. 2005, 407:68-72.

* cited by examiner

*Primary Examiner*—Michael Marcheschi
*Assistant Examiner*—Carlos Barcena
(74) *Attorney, Agent, or Firm*—Frederic J. Zimmerman

(57) ABSTRACT

The present invention relates to a carbon nanotube that contains nitrogen based functional groups (such as nitro, nitroso, N-oxide, oxime, hydroxylamine, diazo, azo, and azide) that are covalently attached to lattice carbons of the carbon nanotube, directly or via a chemical linker. The present invention also relates to methods for the preparation of the carbon nanotube from an amino-functionalized carbon nanotube via an amino oxidation reaction. The synthetic methods of the present invention allow the nitrogen based functional groups to be attached selectively to one of two distinct regions of the carbon nanotube, the ends or the sidewall, and thus enable the synthesis of a carbon nanotube having nitrogen based functional groups substantially concentrated on either the ends or the sidewall of the carbon nanotube.

13 Claims, 11 Drawing Sheets

FUNCTIONALIZATION OF CARBON NANOTUBES

STATEMENT OF GOVERNMENT INTERESTS

The invention described herein may be manufactured and used for the Government of the United States of America for governmental purposes without payment of any royalties thereon or therefore.

TECHNICAL FIELD

The present invention relates to compositions of a functionalized carbon nanotube, which contain nitrogen based functional groups covalently attached to lattice carbons of the carbon nanotube.

BACKGROUND OF THE INVENTION

Single-wall carbon nanotubes ("SWNTs") have the potential to be incorporated into a wide variety of technological applications due to their remarkable physical properties. These properties range from unusually high tensile strength to excellent thermal conductivity. Carbon nanotubes have already been used, as chemical sensors for various gases, in electronic and optical devices, in biological systems, and pharmaceutical applications. Covalent functionalization of carbon nanotubes in a controlled manner plays a central role in tailoring the properties of SWNT devices. Functionalization of SWNTs has been used to integrate carbon nanotubes into systems with interesting mechanical and electrical properties. Bonding between SWNTs and various materials has also been used to incorporate the SWNTs into assemblies, such as reinforced polymer composites. Functionalization of SWNTs with a nitro based group, such as, a nitro group could provide materials with enhanced oxygen and nitrogen contents suitable for application in the energetic material industry. They could also provide sites for hydrogen bonding to form high strength nanocomposites.

Although there are a number of reports on functionalizing carbon nanotubes with groups such as esters, ethers, and amides, there is very limited information available on functionalizing carbon nanotubes with a nitrogen based functional group. The present invention provides a series of nitrogen based functionalized carbon nanotubes.

SUMMARY OF THE INVENTION

In accordance with the present invention, a carbon nanotube is provided with the structure represented by Formula I.

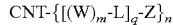

CNT-{[(W)$_m$-L]$_q$-Z}$_n$    I wherein m and q are independently 0 or 1 and n is from 1 to 1,000;

CNT is a carbon nanotube having at least two ends and at least one sidewall, where the carbon nanotube is selected from at least one of a single-walled carbon nanotube, a double-walled carbon nanotube, and a multi-walled carbon nanotube;

Z is a nitrogen based functional group selected from at least one of a nitro, nitroso, N-oxide, oxime, hydroxylamine, diazo, azo, and azide, where the nitrogen based functional group Z is attached covalently to a lattice carbon of the carbon nanotube directly when q is 0 or via a divalent linker L and an optional bridging functional group W when q is 1;

W is a bridging functional group selected from at least one of an ester (—C(O)—O—), carbonate (—O—C(O)—O—), amide (—C(O)—NR$^1$—), carbamate (—O—C(O)—NR$^1$—), urethane (—NR$^1$—C(O)—NR$^2$—), urea (—NR$^1$—C(NR$^3$)—NR$^2$—), ether (—O—), amine (—NR$^1$—), thioether (—S—), sulfoxide (—S(O)—), sulfone (—S(O$_2$)—), and sulfonamide (—S(O$_2$)NR$^1$—), wherein the R$^1$, R$^2$ and R$^3$ each are independently selected from one of hydrogen, C$_{1-20}$ alkyl, C$_{1-20}$ heteroalkyl, C$_{6-20}$ aryl, and C$_{1-10}$ heterocycles; and L is a divalent linker having two ends, selected from at least one of C$_{1-20}$ alkylene, C$_{1-20}$ heteroalkyl, C$_{6-20}$ arylene, and C$_{1-10}$ heterocyclenes, where the linker L includes a first end covalently attached to the nitrogen based functional group Z and a second end covalently attached to a lattice carbon of the carbon nanotube directly when m is 0 or via the bridging functional group W when m is 1.

DETAILED DESCRIPTION OF EXEMPLARY EMBODIMENTS OF THE INVENTION

Figure 1:
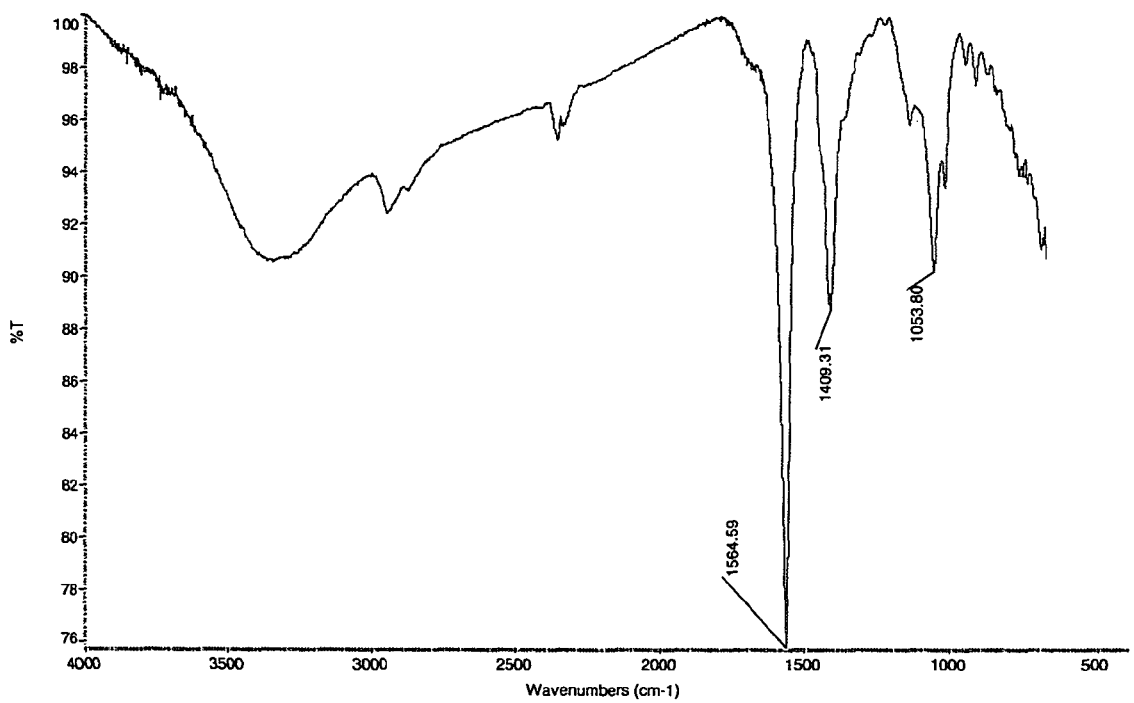
FIG. 1 depicts the ATR-FTIR spectrum of a nitro-functionalized SWNT.

The present invention relates to compositions of a functionalized carbon nanotube, which includes at least one nitrogen based functional group, and more particularly, a plurality of nitrogen based functional groups (including, for example, nitro, nitroso, N-oxide, oxime, hydroxylamine, diazo, azo, and azide) covalently attached to lattice carbons of the carbon nanotube either directly or indirectly via a divalent linker. The present invention also relates to methods for the preparation of the functionalized carbon nanotube from an amino-functionalized carbon nanotube via an amino oxidation reaction. The methods allow the nitrogen based functional groups to be attached selectively to one of two distinct regions of the carbon nanotube, the ends or the sidewall, and thus enable the synthesis of a nitrogen based functionalized carbon nanotube including nitrogen based functional groups substantially concentrated on the ends and/or the wall of the carbon nanotube.

As used in this disclosure, the singular forms "a", "an", and "the" may refer to plural articles unless specifically stated otherwise. Thus, for example, references to a method of functionalizing, derivatizing, or treating "a carbon nanotube" is intended to include a plurality of carbon nanotubes. Furthermore, the use of grammatical equivalents of articles such as "functionalization", "modification", or "derivatization" is not meant to imply differences among these terms unless specifically indicated in the context.

Unless defined otherwise, all technical and scientific terms used herein generally have the same meaning as commonly understood by one of ordinary skill in the art to which this invention belongs. Generally, the nomenclature used herein and the laboratory procedures in analytical chemistry, organic chemistry, material sciences, and nanotechnology described herein are those well known and commonly employed in the art. Standard techniques, or modifications thereof, are used for chemical syntheses and chemical analyses of the present invention (see generally, March, "ADVANCED ORGANIC CHEMISTRY: REACTIONS, MECHANISMS, AND STRUCTURE", 3rd ed. (1985) John Willey & Sons, New York, N.Y.)

To facilitate understanding of the invention set forth in the disclosure that follows, a number of abbreviations and terms are defined below.

ABBREVIATIONS

ATR-FTIR—attenuated-total-reflection Fourier-transform infrared
CNT—carbon nanotube
DMF—dimethylforamide
DPPA—diphenylphosphoryl azide
DSC—differential scanning calorimetry
DWNT—double-walled carbon nanotube
mCPBA—meta-chloroperbenzoic acid
MWNT—multi-walled carbon nanotube
R—a general abbreviation for a substituent group selected from alkyl, heteroalkyl, aryl, and heterocycles
SWNT—single-walled carbon nanotube
SWNT-COOH—carboxyl-functionalized single-walled carbon nanotube
SWNT-NH$_2$—primary amino-functionalized single-walled carbon nanotube
SWNT-NO$_2$—nitro-functionalized single-walled carbon nanotube.
TGA—thermogravimetric analysis.
THF—tetrahydrofuran

DEFINITION

The term "aspect ratio" refers to a ratio of the length over the diameter of a carbon nanotube.

The term "alkyl" refers to a saturated aliphatic hydrocarbon having a specified number of carbon atoms, which may be linear or branched or combinations thereof. For example, "$C_{1-6}$ alkyl" and "$C_{1-10}$ alkyl" denote alkyl having 1 to 6 or 1 to 10 carbon atoms, respectively. Examples of alkyl include, but are not limited to, methyl, ethyl, n-propyl, i-propyl, n-butyl, i-butyl, sec-butyl, t-butyl, n-pentyl, n-hexyl, n-octyl, n-nonyl, n-decyl and the like. Additionally, unless otherwise specified, "propyl" denotes n-propyl or i-propyl; "butyl" denotes n-butyl, i-butyl, sec-butyl, or t-butyl. As used herein, the term "alkyl" also includes, unless otherwise specified, those groups described below as "alkenyl," "alkynyl," "cycloalkyl," and "cycloalkyl(alkyl)".

The term "alkylene" refers to a divalent radical derived from an alkane, as exemplified, but not limited, by —CH$_2$— CH$_2$—CH$_2$—CH$_2$—, and further includes alkenylene (a divalent radical derived from an alkenyl), alkynylene (a divalent radical derived from an alkynyl), cycloalkylene (a divalent radical derived from a cycloalkyl, and cycloalkyl(alkylene) (a divalent radical derived from cycloalkyl(alkyl)). Generally, an alkylene group has from 1 to 25, from 1 to 20, from 1 to 15, from 1 to 10, or from 1 to 6 carbon atoms. When an alkylene group serves as a bridging group, no orientation of the bridging group is implied by the direction in which the formula of the bridging group is written.

The term "alkenyl" refers to a hydrocarbon chain of either a linear or branched configuration with one or more unsaturated carbon-carbon bonds, which may occur in any stable point along the chain, for example, "$C_{2-6}$ alkenyl" include but are not limited to ethenyl, 1-propenyl, 2-propenyl, 1-butenyl, 2-butenyl, 3-butenyl, 3-methyl-2-butenyl, 2-pentenyl, 3-pentenyl, hexenyl, and the like.

The term "alkynyl" refers to a hydrocarbon chain of either a straight or branched configuration with one or more carbon-carbon triple bonds, which may occur in any stable point along the chain, for example, "$C_{2-6}$ alkynyl" include but not limited to ethynyl, 1-propynyl, 2-propynyl, 1-butynyl, 2-butynyl, 3-butynyl, and the like.

The term "cycloalkyl" refers to a saturated ring group and a non-aromatic unsaturated ring group having the specified number of carbon atoms. For example, "$C_{3-6}$ cycloalkyl" denotes such as cyclopropyl, cyclobutyl, cyclopentyl, cyclohexyl, 3-cyclohexenyl, and cycloheptyl.

The term "cycloalkyl(alkyl)" refers to an alkyl group with a cycloalkyl attached to one of the carbons of the alkyl group. For example, "$C_{3-6}$ cycloalkyl($C_{1-4}$ alkyl)" denotes such as cyclopropylmethyl, 1-cyclopropylethyl, 2-cyclopropylethyl, cyclobutylmethyl, 2-cyclobutylethyl, cyclopentylmethyl, 2-cyclopentylethyl, cyclohexylmethyl, and 2-cyclohexylethyl.

The term "heteroalkyl," refers to a stable straight or branched hydrocarbon radical, which contains a stated number of carbon atoms and at least one heteroatom selected from a halogen (F, Cl, Br, and I), O, N, P, S, and Si, where the heteroatom may optionally be oxidized. The heteroatoms, O, N, P, S, and Si, may be placed at any interior position of the heteroalkyl group or at the position at which the alkyl group is attached to the remainder of the molecule. Some examples include, but are not limited to, —CH$_2$—CH$_2$—O—CH$_3$, —CH$_2$—CH$_2$—NH—CH$_3$, —CH$_2$—CH$_2$—N(CH$_3$)—CH$_3$, —CH$_2$—CH$_2$—S—CH$_3$, —CH$_2$—CH$_2$—S(O)—CH$_3$, —CH$_2$—CH$_2$—S(O)$_2$—CH$_3$, —CH=CH—O—CH$_3$, —Si (CH$_3$)$_3$. Up to two heteroatoms may be consecutive, such as, for example, —CH$_2$—NH—OCH$_3$, and —CH$_2$—O—Si (CH$_3$)$_3$.

The term "heteroalkylene" refers to a divalent radical derived from heteroalkyl, as exemplified, but not limited by, —CH$_2$—CH$_2$O—CH$_2$—, —CH$_2$—CH$_2$—C(O)—NH—CH$_2$—, —CH$_2$—NH—C(O)—NH—CH$_2$—, —CH$_2$—O—C(O)—NH—CH$_2$—, —CH$_2$—CH$_2$—C(NH)—NH—CH$_2$—, —CH$_2$—CH$_2$—S(O)—CH$_2$—. For heteroalkylene groups, heteroatoms can also occupy either or both of the chain termini (e.g., alkyleneoxy, alkylenedioxy, alkyleneamino, alkylenediamino, and the like). When a heteroalkylene group serves as a bridging group, no orientation of the bridging group is implied by the direction in which the formula of the bridging group is written. For example, the formula —C(O)$_2$R'— represents both —C(O)$_2$R' and —R'C(O)$_2$—.

The term "aryl" refers to a substituted or unsubstituted polyunsaturated, aromatic hydrocarbon which can be a single ring or multiple rings which are fused together or linked covalently. Non-limiting examples of aryl groups include phenyl, 1-naphthyl, 2-naphthyl, and 4-biphenyl.

The term "arylene" refers to a divalent radical derived from an aryl group, as exemplified, but not limited to, by -Ph-.

The term "heterocyclyl," "heterocycle," and "heterocyclic" refer to a saturated, partially unsaturated and unsaturated cyclic radical that contains from one to four heteroatoms selected from N, O, and S, where the nitrogen, carbon and sulfur atoms are optionally oxidized, and the nitrogen atom(s) are optionally quaternized. Examples of saturated heterocyclyl radicals include saturated 3 to 6-membered heteromonocyclic group containing 1 to 4 nitrogen atoms (e.g. pyrrolidinyl, imidazolidinyl, piperidino, piperazinyl, etc.); saturated 3 to 6-membered heteromonocyclic group containing 1 to 2 oxygen atoms and 1 to 3 nitrogen atoms (e.g. morpholinyl, etc.); saturated 3 to 6-membered heteromonocyclic group containing 1 to 2 sulfur atoms and 1 to 3 nitrogen atoms (e.g., thiazolidinyl, etc.). Examples of partially unsaturated heterocyclyl radicals include dihydrothiophene, dihydropyran, dihydrofuran and dihydrothiazole. Heterocyclyl radicals may include pentavalent nitrogen, such as in tetrazolium and pyridinium radicals. The term "heteroaryl" refers to unsaturated heterocyclyl radicals. Examples of heteroaryl radicals include unsaturated 3 to 6 membered heteromonocyclic group containing 1 to 4 nitrogen atoms, for example, pyrrolyl, pyrrolinyl, imidazolyl, pyrazolyl, pyridyl, pyrimidyl, pyrazinyl, pyridazinyl, triazolyl (e.g., 4H-1,2,4-triazolyl, 1H-1,2,3-triazolyl, 2H-1,2,3-triazolyl, etc.) tetrazolyl (e.g. 1H-tetrazolyl, 2H-tetrazolyl, etc.), etc.; unsaturated condensed heterocyclyl group containing 1 to 5 nitrogen atoms, for example, indolyl, isoindolyl, indolizinyl, benzimidazolyl, quinolyl, isoquinolyl, indazolyl, benzotriazolyl, tetrazolopyridazinyl (e.g., tetrazolo[1,5-b]pyridazinyl, etc.), etc.; unsaturated 3 to 6-membered heteromonocyclic group containing an oxygen atom, for example, pyranyl, furyl, etc.; unsaturated 3 to 6-membered heteromonocyclic group containing a sulfur atom, for example, thienyl, etc.; unsaturated 3- to 6-membered heteromonocyclic group containing 1 to 2 oxygen atoms and 1 to 3 nitrogen atoms, for example, oxazolyl, isoxazolyl, oxadiazolyl (e.g., 1,2,4-oxadiazolyl, 1,3,4-oxadiazolyl, 1,2,5-oxadiazolyl, etc.) etc.; unsaturated condensed heterocyclyl group containing 1 to 2 oxygen atoms and 1 to 3 nitrogen atoms (e.g. benzoxazolyl, benzoxadiazolyl, etc.); unsaturated 3 to 6-membered heteromonocyclic group containing 1 to 2 sulfur atoms and 1 to 3 nitrogen atoms, for example, thiazolyl, thiadiazolyl (e.g., 1,2,4-thiadiazolyl, 1,3,4-thiadiazolyl, 1,2,5-thiadiazolyl, etc.) etc.; unsaturated condensed heterocyclyl group containing 1 to 2 sulfur atoms and 1 to 3 nitrogen atoms (e.g., benzothiazolyl, benzothiadiazolyl, etc.) and the like. The terms "heteroaryl and heterocyclyl" also embrace radicals where heterocyclyl radicals are fused with aryl radicals. Examples of such fused bicyclic radicals include benzofuran, benzothiophene, and the like. The heterocyclyl group may have 1 to 6 substituents such as alkyl, hydroxyl, halo, alkoxy, oxo, amino and alkylamino.

The term "heterocyclene" refers to a divalent radical derived from heterocycles.

The term "alkoxy" or "alkyloxy" refers to an alkyl group as defined above with the indicated number of carbon atoms attached through an oxygen bridge. Examples of alkoxy include, but are not limited to, methoxy, ethoxy, n-propoxy, i-propoxy, n-butoxy, s-butoxy, t-butoxy, n-pentoxy, and s-pentoxy.

The term "halogen" refers to fluoro, chloro, bromo, and iodo.

The term "substituted" means that any one or more hydrogens on the designated atom, for example, a carbon atom of an alkyl chain, is replaced with a selection from the indicated group, provided that the designated atom's normal valency is not exceeded, and that the substitution results in a stable compound. The substitution group or substituent can be one of a variety of groups selected from, but not limited to: —OR', =O, =NR', =N—OR', —NR'R'', —SR', -halogen, —SiR'R''R''', —OC(O)R', —C(O)R', —COX, —CONR'R'', —OC(O)NR'R'', —NR''C(O)R', —NR'—C(O)NR''R''', —NR''C(O)$_2$R', —NR—C(NR'R''R''')=NR''', —NR—C(NR'R'')=NR''', —S(O)R', —S(O)$_2$R', —S(O)$_2$NR'R'', —NRSO$_2$R', —CN and —NO$_2$.

The term "heteroatom" refers to oxygen, nitrogen, phosphorus, sulfur, and silicon.

The term "lattice carbon" refers to the carbon atoms which forms the lattice of the ends or the sidewall of a carbon nanotube.

The term "nitrogen based functional group" refers to a functional group, which contains a nitrogen atom. Examples of nitrogen based functional groups include, but are not limited to, nitro, nitroso, N-oxide, oxime, hydroxylamine, diazo, azo, and azide.

Carbon Nanotube

Carbon nanotubes ("CNT") are macromolecules generally in a shape of a long thin cylinder often with a diameter of a few nanometers. The basic structural element in a carbon nanotube is a hexagon which is the same as that found in graphite. Based on the orientation of the tube axis with respect to the hexagonal lattice, a carbon nanotube can have three different configurations: armchair, zigzag, and chiral (also known as spiral). In an armchair configuration, the tube axis is perpendicular to two of the six carbon-carbon bonds of the hexagonal lattice. In a zigzag configuration, the tube axis is parallel to two of the six carbon-carbon bonds of the hexagonal lattice. Both these two configurations are achiral. In chiral configuration, the tube axis forms an angle other than 90 or 180 degrees with any of six carbon-carbon bonds of the hexagonal lattice. Nanotubes of these configurations often exhibit different physical and chemical properties. For example, an armchair nanotube is generally metallic, whereas a zigzag nanotube may be metallic or semiconductive depending on the diameter of the nanotube. All three different nanotubes are expected to be very good thermal conductors along the tube axis, exhibiting a property known as "ballistic conduction," but good insulators laterally to the tube axis.

In addition to an exemplary common hexagonal structure, the cylinder of a carbon nanotube molecule can also contain other size rings, such as pentagon and heptagon. Replacement of some regular hexagons with pentagons and/or heptagons can cause cylinders to bend, twist, or change diameter, and thus lead to some interesting structures such as "Y-", "T-", and "X-junctions". Those various structural variations and configurations can be found in both SWNT and MWNT. However, the present invention is not limited by any particular configuration and structural variation. The carbon nanotube used in the present invention can be in the configuration of armchair, zigzag, chiral, or combinations thereof. The nanotube can also include structural elements other than hexagon, such as, pentagon, heptagon, octagon, or combinations thereof. The structural element other than hexagon on the sidewall of the nanotube is often referred as a defect site, which exhibits different chemical reactivity than the normal hexagonal structural element. In general, the defect site is more active chemically and more susceptible to chemical modifications.

Another structural variation for MWNT molecules is the arrangement of the multiple tubes. A perfect MWNT is like a stack of graphene sheets rolled up into concentric cylinders with each wall parallel to the central axis. However, the tubes can also be arranged so that an angle between the graphite basal planes and the tube axis is formed. Such MWNTs may be known as a stacked cone, Chevron, bamboo, ice cream cone, or piled cone structures. A stacked cone MWNT can reach a diameter of about 100 nm.

Carbon nanotubes used in the present invention can also encapsulate other elements and/or molecules within their enclosed tubular structures. Such elements, for example, include Si, Ti, V, Cr, Mn, Fe, Co, Ni, Cu, Y, Zr, Mo, Ta, Au, Th, La, Ce, Pr, Nb, Gd, Tb, Dy, Ho, Er, Tm, Yb, Lu, Mo, Pd, Sn, and W. Such molecules, for example, include alloys of these elements, such as, alloys of Cobalt with S, Br, Pb, Pt, Y, Cu, B, and Mg, and compounds, such as, the carbides (i.e. TiC, MoC, etc.).

Carbon nanotubes used in the present invention can also be chemically modified and functionalized. Covalent functionalization of carbon nanotubes has commonly been accomplished by three different approaches, namely, thermally activated chemistry, electrochemical modification, and photochemical functionalization. The most common methods of thermally activated chemical functionalization are oxidation reactions. For example, the extensive treatment of a nanotube with concentrated nitric and sulfuric acids leads to the oxidative opening of the tube caps (the ends) as well as the formation of holes in the sidewalls at the defeat sites and thus produces a nanotube decorated with carboxyl groups, which can be further modified through the creation of amide and ester bonds to generate a vast variety of functional groups. The nanotube molecule can also be modified through addition reactions with various chemical reagents such halogens and radicals.

The term "carbon nanotube" used in the present invention covers all structural variations and modification of SWNT and MWNT discussed herein, including configurations, structural defects and variations, tube arrangements, chemical modification and functionalization, and encapsulation.

Generally, a carbon nanotube includes two structurally distinct regions, the end caps and the sidewall, with different chemical reactivity. The end cap of a carbon nanotube structurally resembles a hemispherical fullerence, having similar reactivity of a fullerence. However, the curvature in the sidewall of a carbon nanotube is much less than that of a fullerence of equivalent diameter, and thus the carbon-carbon bonds in the sidewall of a carbon nanotube are much less reactive in general than those in the end caps. Based on their differences in chemical reactivity, the end caps and the sidewall of a carbon nanotube can be selectively derivatized. Recently, carboxylic acid groups have been introduced selectively either at the end caps or the side wall using different chemistries. When SWNTs are treated with an oxidation acid, such as, nitric acid ($HNO_3$), the carboxylic acid groups are introduced nearly exclusively at the end caps. When carbon nanotubes are derivatized using radical chemistry, the carboxylic acid group are exclusively introduced on the sidewall. For example, the reactions of SWNTs with succinic or glutaric acid acyl peroxides under radical chemistry conditions resulted in the addition of 2-carboxyethyl or 3-carboxypropyl groups, respectively, to the sidewall of the SWNT (Peng, et al., *J. Am. Chem. Soc.,* 2003, 125(49):15174-15182).

Carbon nanotubes are commercially available from a variety of sources. Single-walled carbon nanotubes can be obtained from Carbolex (Broomall, Pa.), MER Corporation (Tucson, Ariz.), and Carbon Nanotechnologies Incorporation ("CNI", Houston, Tex.). Multi-walled carbon nanotubes can be obtained from MER Corporation (Tucson, Ariz.) and Helix Material Solution (Richardson, Tex.). However, the present invention is not limited by the source of carbon nanotubes. In addition, many publications are available with sufficient information to allow one to manufacture nanotubes with desired structures and properties. The most common techniques are arc discharge, laser ablation, chemical vapor deposition, and flame synthesis. In general, the chemical vapor deposition has shown the most promise in being able to produce larger quantities of nanotubes at lower cost. This process is usually done by reacting a carbon-containing gas, such as, acetylene, ethylene, ethanol, etc., with a metal catalyst particle, such as cobalt, nickel, or ion, at temperatures above 600° C.

In exemplary embodiments of the present invention, the carbon nanotube is substantially a single-walled nanotube, with a carbon content of no less than 60%, no less than 80%, no less than 90%, no less than 95%, no less than 98%, or no less than 99% by weight, and a purity of no less than 60%, no less than 80%, no less than 90%, no less than 95%, no less than 98%, or no less than 99% by weight. In exemplary embodiments, the carbon nanotube includes a diameter from about 0.2 nm to about 100 nm, from about 0.4 nm to about 80 nm, from about 0.5 nm to about 60 nm, or from about 0.5 nm to 50 nm; a length of no greater than about 200 micrometers, no greater than 100 micrometers, no greater than about 50 micrometers, or no greater than 20 micrometers; an aspect ratio of no greater than 1,000,000, no greater than 100,000, no greater than 10,000, no greater than 1,000, no greater than 500, no greater than 200, or no greater than 100.

In certain exemplary embodiments, the carbon nanotube is substantially a double-walled nanotube, with a carbon content, purity, diameter, length, and aspect ratio, as described above. In certain exemplary embodiments, the carbon nanotube is substantially a multi-walled nanotube, with a carbon content, purity, diameter, length, and aspect ratio, as described above.

Carbon Nanotube

The carbon nanotube of the present invention contains at least one nitrogen based functional groups, such as nitro, nitroso, N-oxide, oxime, hydroxylamine, diazo, azo, and azide, covalently attached to lattice carbons of the carbon nanotube either directly or indirectly through a linker as represented in Formula I.

In an embodiment, the nitrogen based functional group Z is directly attached to a lattice carbon of the carbon nanotube, as represented by Formula $$CNT\text{-}[Z]_n \qquad \qquad II$$

wherein n, Z, and CNT are as described above for Formula I.

In another embodiment, the nitrogen based functional group Z is indirectly attached to a lattice carbon of the carbon nanotube via a linker L, as represented by Formula III.

$$CNT\text{-}[L\text{-}Z]_n \qquad \qquad III$$

wherein n, Z, L, and CNT are as described above for Formula I.

In yet another exemplary embodiment, the nitrogen based functional group Z is indirectly attached to a lattice carbon of the carbon nanotube via a linker L and a bridging functional group W, as represented by Formula N.

$$CNT\text{-}[W\text{-}L\text{-}Z]_n \qquad \qquad IV$$

wherein n, Z, L, W, and CNT are as described above for Formula I.

In an aspect of these embodiments, the carbon nanotube includes at least one nitrogen based functional group attached covalently to a lattice carbon on at least one end of the carbon nanotube. In another aspect, the nitrogen based functional groups attached, directly or indirectly, to lattice carbons are concentrated substantially on at least one end of the carbon nanotube. In yet another aspect, the nitrogen based functional groups attached, directly or indirectly, to lattice carbons are concentrated substantially on the sidewall of the carbon nanotube. In yet another aspect, the carbon nanotube includes at least one nitrogen based functional group attached covalently to a lattice carbon on at least one end of the carbon nanotube and at least one nitrogen based functional group attached covalently to a lattice carbon on the sidewall.

In certain exemplary embodiments, the attachment of the nitrogen based functional groups to the ends can be different from the attachment to the sidewall of the carbon nanotube. For example, the carbon nanotube includes nitrogen based functional groups attached to both the ends and the sidewall of a SWNT. The nitrogen based functional groups on the ends of the SWNT are linked directly to the lattice carbons of the ends as in Formula II whereas the nitrogen based functional groups on the sidewall are linked through a linker, such as ethylene, to the lattice carbons of the sidewall as in Formula III.

In certain exemplary embodiments, the carbon nanotube is a substantially purified carbon nanotube, which may be prepared by extensively washing the carbon nanotube after reactions to remove impurities and then dried under vacuum. Generally, the impurities are not carbon nanotubes, including, for example, the reagents used in the reactions and the by products generated during the reactions. As such, the substantially purified carbon nanotube is essentially free of impurities. In an exemplary embodiment, the substantially purified carbon nanotube includes less than about 5%, less than about 4%, less than about 3%, less than about 2%, less than about 1%, less than about 0.5%, or less than about 0.1% by weight of impurities.

In exemplary embodiments, the substantially purified carbon nanotube includes less than about 5%, less than about 4%, less than about 3%, less than about 2%, less than about 1%, less than about 0.5%, or less than about 0.1% by weight of the chemical reagents used and the byproducts generated during Curtius rearrangement reaction.

In an exemplary embodiment, the carbon nanotube is a nitro-functionalized SWNT, in which nitro groups are connected directly to the lattice carbons of the carbon nanotube as in Formula II. The nitro-functionalized SWNT is characterized by Fourier transfer infrared spectroscopy ("FTIR"), differential scanning calorimetry ("DSC"), and thermogravimetric analysis ("TGA"). As shown in FIG. 1, the nitro-functionalized SWNT has a very strong absorption peak from about 1450 cm$^{-1}$ to about 1620 cm$^{-1}$ and a strong absorption peak from about 1300 cm$^{-1}$ to about 1450 cm$^{-1}$, which correspond to the asymmetric and symmetric stretching modes of nitro group, respectively. The nitro-functionalized SWNT further has a strong absorption peak at from about 930 cm$^{-1}$ to about 1200 cm$^{-1}$, corresponding to C—N stretching modes.

Figure 2:
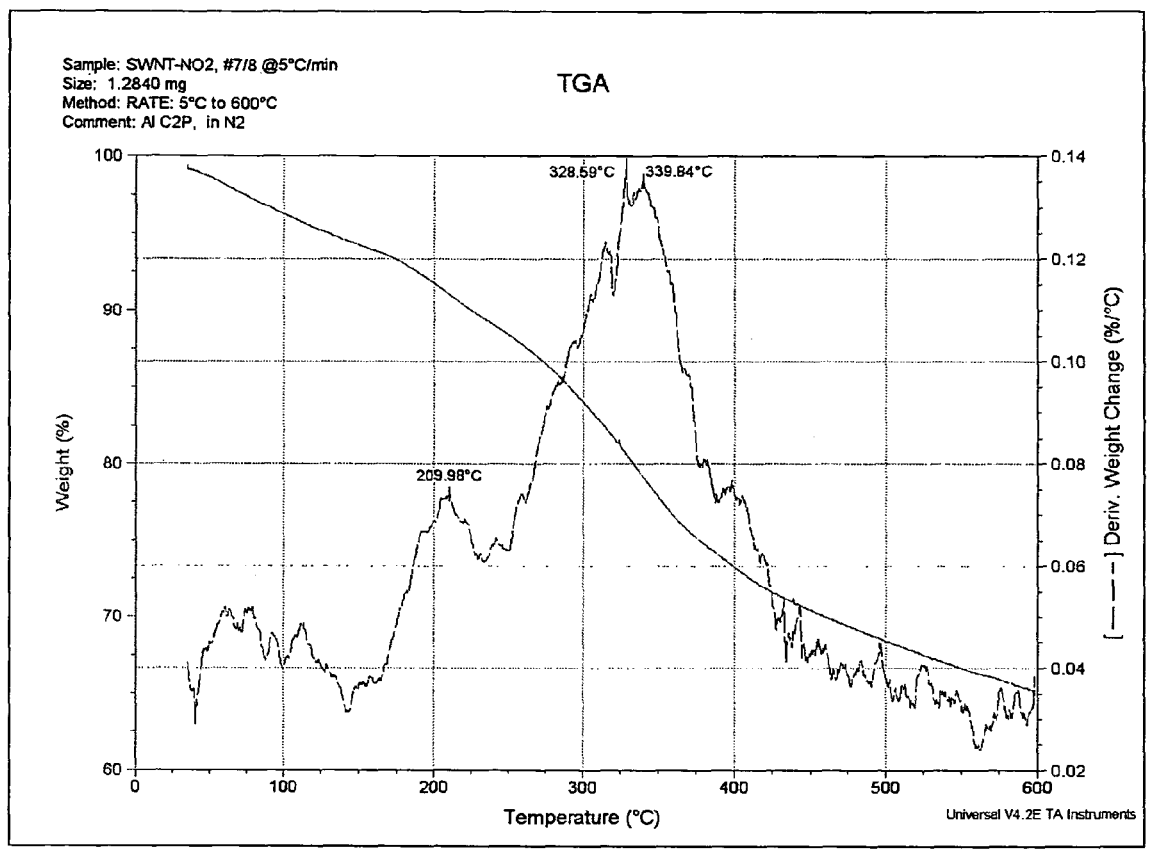
FIG. 2 depicts the TGA plot of a nitro-functionalized SWNT.
Figure 3:
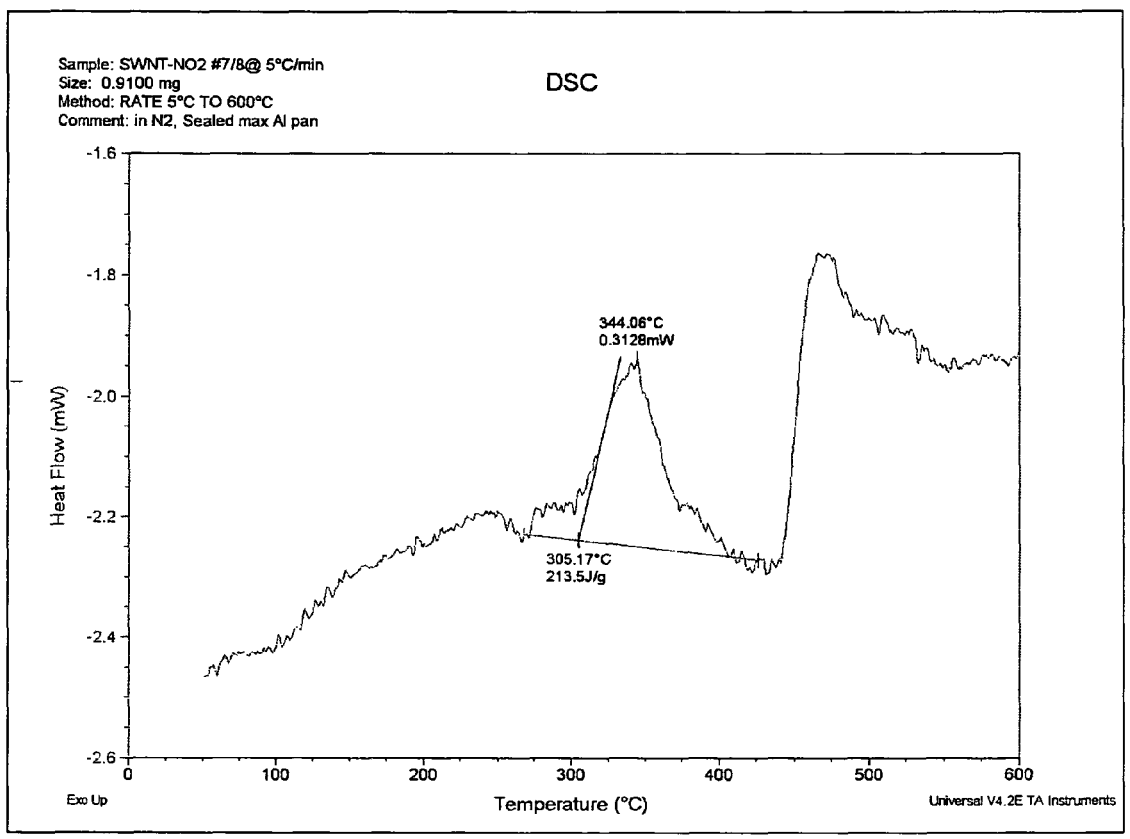
FIG. 3 depicts the DSC plot of a nitro-functionalized SWNT.

TGA analysis for the nitro-functionalized SWNT is shown in FIG. 2, indicating that the majority of the mass loss occurs in the region around 330° C. with a total weight loss of about 30% for the dissociation of the nitro groups. The TGA analysis also shows an initial, smaller weight loss of 10%, which occurs around 210° C., suggesting that there are two different populations of nitro groups attached to the carbon nanotubes, which may correspond to those nitro groups attached to the two different regions of the carbon nanotube. The DSC data for SWNT-NO$_2$ product is shown in FIG. 3, indicating that an exothermic dissociation around 345° C., which is in agreement with the TGA analytical data. In addition to the above data, the present invention, that is, the functionalized carbon nanotubes with the nitrogen based functional group also includes physical properties, including, but without limitation, a specific conductivity, a specific heat of combustion and a specific ignition behavior.

Preparation of Carbon Nanotubes

In accordance with the present invention, the carbon nanotube is synthesized from an amino-functionalized carbon nanotube, as represented by Formula V, by converting the amino group to a nitrogen based functional group through an oxidation reaction.

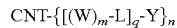

CNT-{[(W)$_m$-L]$_q$-Y}$_n$      V wherein m, q, n, CNT, W, and L are as described above for Formula I; and Y is an amino group, NR$^1$R$^2$, wherein the amino group is attached covalently to a lattice carbon of the carbon nanotube directly when q is 0 or via a divalent linker L and an optional bridging functional group W when q is 1, wherein the R$^1$, R$^2$ and R$^3$ each are independently selected from one of hydrogen, C$_{1-20}$ alkyl, C$_{1-20}$ heteroalkyl, C$_{6-20}$ aryl, and C$_{1-10}$ heterocycle.

Figure 4:
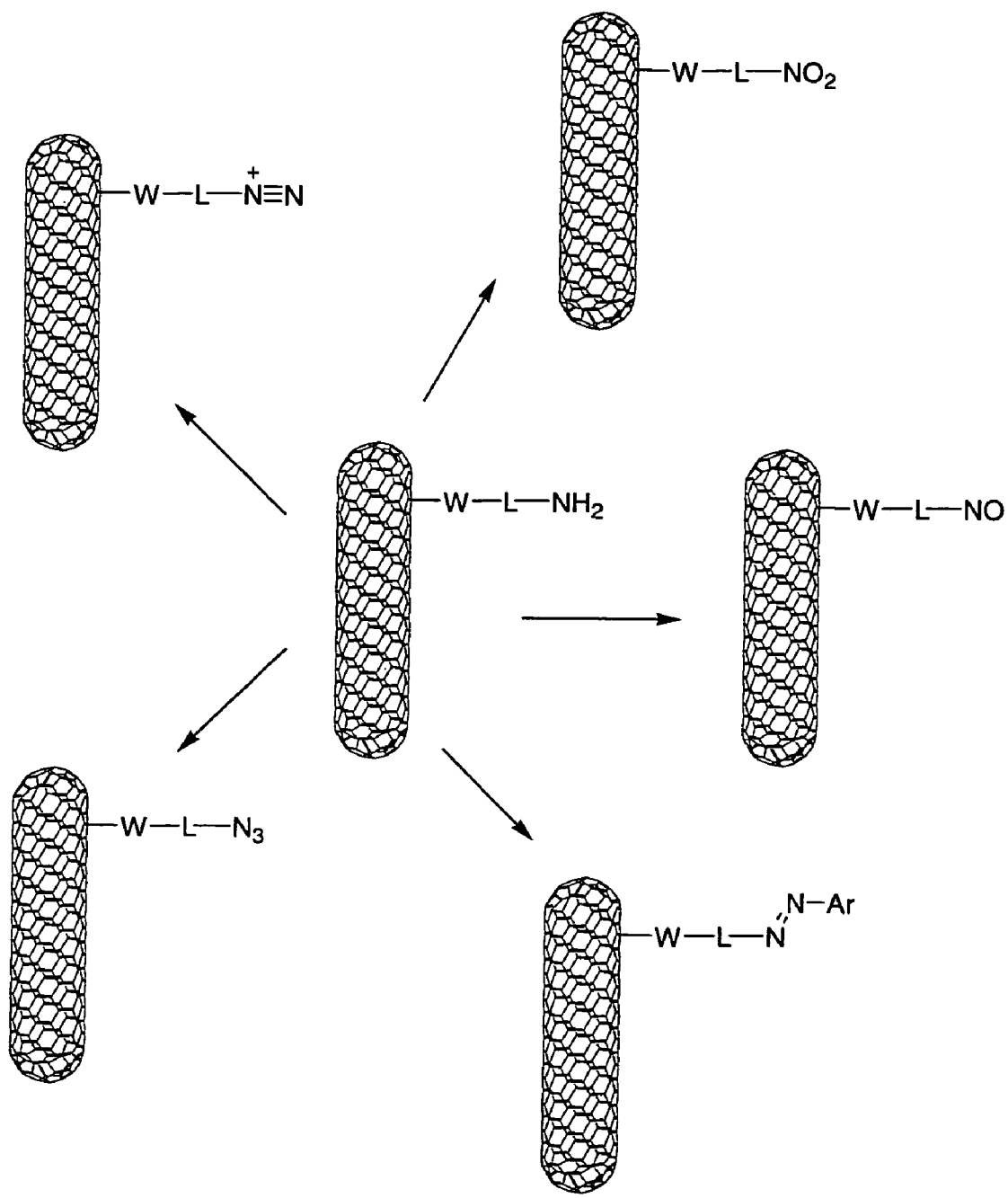
FIG. 4 depicts common nitrogen based functional groups formed via primary amine oxidation.
Figure 5:
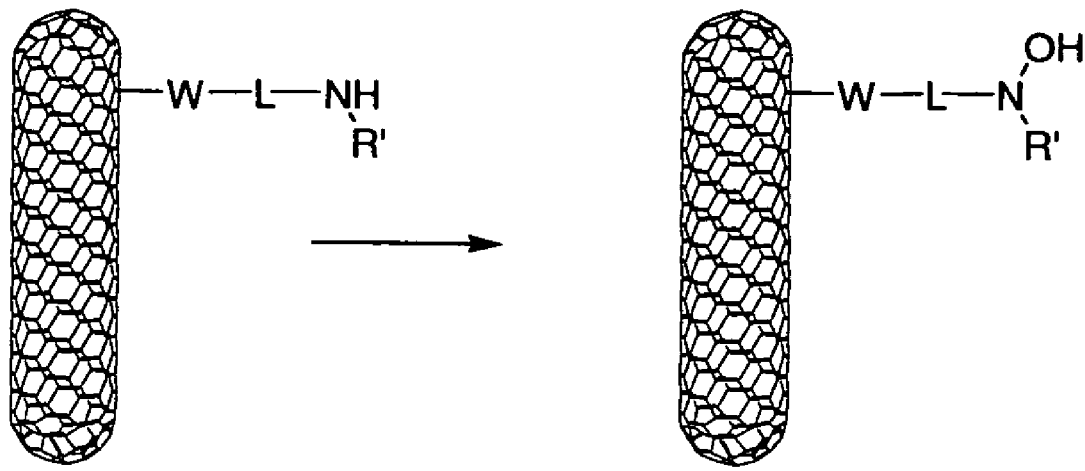
FIG. 5 depicts a common product of secondary amine oxidation.
Figure 6:
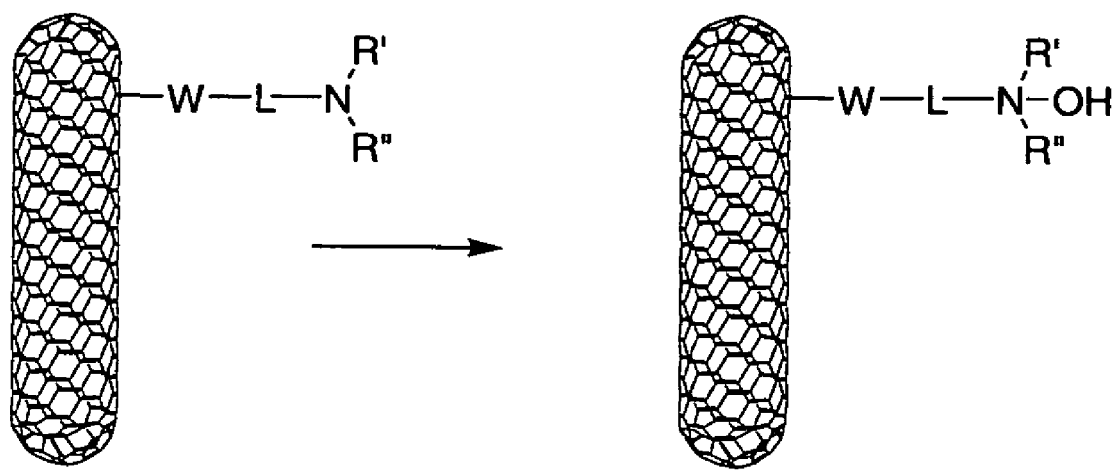
FIG. 6 depicts a common product of tertiary amine oxidation.

A vast variety of oxidation reagents well known in the art of organic chemistry can be used in the present invention for converting an amino group into a nitrogen based functional group, including organic and inorganic oxidants. The oxidation product of an amine or an amino group depends on the structure of the amine, including the substitution on the nitrogen atom (i.e., primary, second, or tertiary) and the substitution on the alpha carbon next to the nitrogen atom of the amine, the oxidation reagent, and reaction conditions. As shown in FIGS. 4, 5, and 6, primary amines can be converted into nitro, nitroso when there is no α-hydrogen, oxime when there is a α-hydrogen, diazo, azo and azide. A secondary amine can be oxidized to a hydroxylamine group by an oxidation reagent such as benzoyl peroxide and Na$_2$HPO$_4$ (Biloski and Ganem, *Synthesis,* 1983, 537). A tertiary amine can readily be oxidized to N-oxide.

In an exemplary embodiment, the nitrogen based functional group of the carbon nanotube is nitro. The nitro-functionalized carbon nanotube may be prepared from an amino-functionalized carbon nanotube with primary amines via an oxidation reaction. Compounds useful for this transformation encompass peroxygen compounds, including dioxiranes, inorganic and organic peracids, organic and inorganic peroxides, hypofluorites, and mixtures thereof.

The dioxirane is a three-member ring peroxide with the structure of Formula VI. Suitable examples of dioxirane include dimethyl dioxirane and methyltrifluoro dioxirane.

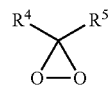

VI wherein R$^4$ and R$^5$ each are independently selected from one of C$_{1-10}$ alkyl, C$_{1-10}$ heteroalkyl, C$_{6-10}$ aryl, and a C$_{1-6}$ heterocycle.

The organic peroxyacids include peroxycarboxylic acids of the structure of R$^6$(C(O)OOH)$_n$, wherein n is 1, 2, 3, 4, or 5; and R$^6$ is H, C$_{1-20}$ alkyl, C$_{1-20}$ heteroalkyl, C$_{6-20}$ aryl, or C$_{1-10}$ heterocycle. Examples of peroxyacids suitable for use in the present invention include peracetic acid (peroxyacetic acid), m-chloroperoxybenzoic acid ("mCPBA"), and magnesium monoperoxyphthalate hexahydrate, all of which are commercially available. Others include performic acid (peroxy formic acid) (HC(O)OOH), peroxytrifluoroacetic acid, and perbenzoic acid (benzoyl hydroperoxide). As used herein, the prefixes "peroxy" and "peroxo" are used interchangeably. Still others include salts of peroxyacids, such as alkali metals, alkaline earth metals, lanthanides, divalent zinc and uranyl salts.

Inorganic peroxoacids include persulfates, such as Na, K or $NH_4$ persulfate, peroxosulfuric acid (persulfuric acid or Caro's acid, $H_2SO_5$), peroxomonosulfates and salts thereof, such as potassium peroxomonosulfate (OXONE®), peroxodisulfates and salts thereof, such as ammonium peroxodisulfate (($NH_4$)$_2S_2O_8$, also known as ammonium persulfate), potassium peroxodisulfate ($K_2S_2O_8$), and sodium peroxodisulfate ($Na_2S_2O_8$).

The organic peroxides include peroxides of the formula, $R^6(OOH)_n$, where n is 1, 2, 3, 4, or 5; and $R^6$ is H, $C_{1-20}$ alkyl, $C_{1-20}$ heteroalkyl, $C_{6-20}$ aryl, or $C_{1-10}$ heterocycle. Examples of organic peroxides include, but not limited to, methyl, ethyl, isopropyl, n-butyl, i-butyl, or t-butyl, cumene, and ethylbenzyl peroxides. Inorganic peroxides that may be used include hydrogen peroxide, perborates, and percarbonates. Still other materials include peroxides of alkali metals (such as sodium perborate), alkaline earth metals, lanthanides, divalent zinc and uranyl ion. These species release hydrogen peroxide when in contact with water or dilute aqueous acid. Those species having high thermal stability are suitable for the slow release of peroxide.

A co-catalyst may be used in conjunction with some oxidizing agents, particularly with peroxides. Suitable co-catalysts include metal oxides such as $V_2O_4$, $CrO_3$, $MoO_3$, $WO_3$, $OsO_4$, $RuO_4$, $TiO_2$ and ferrous sulfate.

The hypofluorite, as used herein, refers to a molecule having a formula of $C_xH_yF_z(OF)_aO_b$, where x is a number ranging from 0 to 8, y is a number ranging from 0 to 17, z is a number ranging from 0 to 17, a is 1 or 2, and b is 0, 1, or 2. Examples of hypofluorites include fluoroxytrifluoromethane ($CF_3OF$), methylhypofluorite ($CH_3OF$), hypofluorous acid (HOF) (Rozen, *Pure Appl. Chem.* 1999, 71:481-487), trifluoroacetyl hypofluorite ($CF_3C(O)OF$), acetyl hypofluorite ($CH_3C(O)OF$), and bis-(fluoroxy)difluoromethane ($CF_2(OF)_2$).

Other suitable oxidants for use in the present invention include ozone (Keinan and Mazur, *J. Am. Chem. Soc.*) and tetra-n-alkylammonium bormates (Das, et al., *Synth. Comm.* 2004, 34:2359-2363).

The method of preparation of the functionalized carbon nanotube of the present invention includes the step of oxidizing an amino-functionalized carbon nanotube with an oxidation reagent. In an exemplary embodiment, the oxidation reaction is performed in a suitable solution, such as a solution of the oxidant in an organic solvent. While reacting conditions may vary within a wide range, suitable conditions for converting the amines of the amino-functionalized carbon nanotube into nitro groups may include, but not limited to, a temperature from about −30° C. to about 250° C., from about 0° C. to about 200° C., from about 10° C. to about 150° C., from about 10° C. to about 100° C., from about 20° C. to about 90° C., from about 20° C. to about 80° C., from about 20° C. to about 70° C., from about 30° C. to about 70° C., from about 40° C. to about 70° C., from about 50° C. to about 70° C., or from about 60° C. to about 70° C.; and a pressure from about 1 psi to about 150 psi, from about 2 psi to about 100 psi, from about 3 psi to about 50 psi, from about 4 psi to about 40 psi, from about 5 psi to about 30 psi, from about 6 psi to about 25 psi, from about 7 psi to about 20 psi, from about 8 psi to about 20 psi, from about 10 psi to about 20 psi, or from about 14 psi to about 15 psi; or at the normal atmosphere pressure.

A reaction time for the oxidation highly depends on the specific oxidization reagent and the experimental condition. A sufficient period time for the oxidation is a period of time that is required for the completion of the reaction, in particular, from about 0.5 hours to about 120 hours, more particularly from about 1 hour to about 60 hours, even more particularly about 36 hours, about 24 hours, about 12 hours, about 10 hours, or about 8 hours. The oxidation reaction may also contains a solvent. Suitable solvents include, but are not limited to, dimethylforamide ("DMF"), dimethylsulfoxide ("DMSO"), tetrahydrofuran ("THF"), toluene, benzene, chloroform, and methylene chloride.

In another exemplary embodiment, the nitrogen based functional group of the carbon nanotube is a nitroso moiety. The nitroso functionalized carbon nanotube may be prepared from the amino-functionalized carbon nanotube with primary amino groups via an oxidation reaction with an appropriate oxidation reagent for a sufficient period of time. To form a stable nitroso group, it is necessary that the aliphatic amino group has no alpha-hydrogen. Some non-limiting examples of oxidation reagents include "Caro's acid" ($H_2SO_5$) and hydrogen peroxide ($H_2O_2$) in acetic acid (HOAc) (Holms and Bayer, *J. Am. Chem. Soc.* 1960, 82:3454 and Gorrod, *Tetrahedron Lett.* 1968, 6155).

In yet another embodiment, the nitrogen based functional group of the carbon nanotube is hydroxylamine or N-oxide. The hydroxylamine-functionalized carbon nanotube may be prepared from the amino-functionalized carbon nanotube with a secondary amino group via oxidation reactions with an appropriate oxidation reagent for a sufficient period of time. The N-oxide-functionalized carbon nanotube may be prepared from the amino-functionalized carbon nanotube with a tertiary amino group via oxidation reactions with an appropriate oxidation reagent. Compounds suitable for the transformation of an amino group to a hydroxylamine group or N-oxide encompass peroxygen compounds, including dioxiranes, inorganic peracids, organic peracids and salts of inorganic and organic peracids, and organic and inorganic peroxides, as described hereinabove.

In yet another embodiment, the nitrogen based functional group of the carbon nanotube is an oxime moiety. The oxime-functionalized carbon nanotube may be prepared from the amino-functionalized carbon nanotube with primary amino groups having alpha-hydrogens via an oxidation reaction with an appropriate oxidation reagent for a sufficient period of time. Compounds suitable for the transformation of an amino group to an oxime group encompass peroxygen compounds, including dioxiranes, inorganic peracids, organic peracids and salts of inorganic and organic peracids, and organic and inorganic peroxides, as described hereinabove. Some non-limiting examples of suitable oxidation reagents include "Caro's acid" ($H_2SO_5$) and hydrogen peroxide ($H_2O_2$) in acetic acid (HOAc) (Holms and Bayer, *J. Am. Chem. Soc.* 1960, 82:3454 and Gorrod, *Tetrahedron Lett.* 1968, 6155).

In yet another embodiment, the nitrogen based functional group of the carbon nanotube is an azide. The azide-functionalized carbon nanotube may be prepared from the amino-functionalized carbon nanotube with primary amino groups via an oxidation reaction with an appropriate oxidation reagent for a sufficient period of time. Some non-limiting examples of oxidation reagents include tosyl azide and nitrous oxide ($N_2O$) (Koga and Anselme, *Chem. Commun.* 1968, 446).

In still another embodiment, the nitrogen based functional group of the carbon nanotube is an azo group. The azo-functionalized carbon nanotube may be prepared from the amino-functionalized carbon nanotube with primary amino groups via an oxidation reaction with an appropriate oxidation reagent for a sufficient period of time. For example, an azo group can be formed by the condensation of an amino compound with a nitroso compound.

In an alternative exemplary embodiment, the nitrogen based functional group of the carbon nanotube is diazo. The diazo-functionalized carbon nanotube may be prepared from the amino-functionalized carbon nanotube with primary amino groups via an oxidation reaction with an appropriate oxidation reagent for a sufficient period of time. Some non-limiting examples of oxidation reagents include nitrous acid tosyl azide and isoamyl nitrite. The term diazo as used herein also includes diazonium group. There are many methods for the preparation of diazo groups in the literatures. Some further examples can be found in *Organic Syntheses III*, 392, *Organic Syntheses* IV, 424, and *Organic Syntheses* 52, 53, which are all incorporated herein by reference.

Amino-Functionalized Carbon Nanotubes:

The carbon nanotube of the present invention is prepared from an amino-functionalized carbon nanotube, which can readily be prepared from a carboxylic acid-functionalized carbon nanotube using various synthetic methodologies, including direct amidation with a diamine, amide reduction, and transformation of carboxylic acid via a rearrangement reaction, such as Hofmann, Curtius, Schmidt, and Lossen reactions (FIGS. 7 and 8), which are well known in the field of organic chemistry. The carbon nanotube used in the present invention is SWNT, DWNT, MWNT, or combinations thereof. In an exemplary embodiment, the amino-functionalized carbon nanotube was synthesized from a carboxylic acid functionalized carbon nanotube through a multi-step functional group transformation. The carboxylic acid-functionalized carbon nanotube may be made chemically or electrochemically using synthetic methods that are well known in the art. Suitable oxidation reagents for introducing carboxylic acid groups to a carbon nanotube include, but are not limited to, nitric acid ($HNO_3$), a mixture of nitric acid ($NHO_3$) and sulfuric acid ($H_2SO_4$), perchloric acid ($HClO_4$), a mixture of sulfuric acid ($H_2SO_4$) and potassium dichromate ($K_2Cr_2O_7$), a mixture of sulfuric acid and potassium permanganate ($KMnO_4$).

Conversion of the carboxyl acids to amino groups may be achieved by Curtius rearrangement, which includes converting the carboxylic acids into acyl azide groups, transforming the acyl azide groups to isocyanate groups by subjecting the acyl azide-functionalized carbon nanotube to Curtius rearrangement condition, and hydrolyzing the isocyanate groups in a hydrolytic solution to form the amine groups. The amino groups may be transformed into amino functional groups via amine oxidation as discussed hereinabove.

The acyl azides are readily prepared from the carboxylic acids in a single step using a reagent such as diphenylphosphoryl azide ("DPPA"). In an exemplary embodiment, the acyl azide formation is carried out in an organic solvent at a temperature of below about 150° C., below about 100° C., below about 90° C., below about 70° C., no greater than about 60° C., no greater than about 50° C., no greater than about 40° C., no greater than about 30° C., or a room temperature, which is about 24° C. to about 26° C. Suitable solvents for this functional group transformation may include, but are not limited to, DMF, DMSO, methylene chloride, chloroform, 1,2-dichlorethane, THF, toluene, benzene, ether, and hexane.

The acyl azides may also be made by first activating the carboxyl groups with an activation reagent and reacting the activated carboxyl groups with sodium azide. A variety of reagents well know in the arts of organic chemistry and peptide chemistry may be used for activating the carboxylic acid groups. Some common activation reagents may include alkyl or aryl chloroformate for forming mixed anhydride and thionyl chloride for acyl chloride. Another approach for the synthesis of acyl azides may use diazotization chemistry, in which the carboxylic acids are first converted into acid hydrazides and reacted with nitrous acid.

Curtius rearrangement is generally carried out by simply heating the acyl azides to an elevated temperature range in an organic solvent for a sufficient period of time to form isocyanates. Since the isocyanates generally have low thermal stability, the reaction temperature has to be selected with care to avoid undesired thermal decomposition of isocyanates. Generally, Curtius rearrangement may be carried out at an elevated temperature range between about 35° C. to about 150° C., about 50° C. to about 140° C., about 60° C. to about 130° C., about 70° C. to about 120° C., about 70° C. to about 110° C., about 80° C. to about 110° C., about 90° C. to about 110° C., about 90° C. to about 105° C., about 95° C. to about 105° C., or about 100° C. Suitable solvents for this functional group transformation may include, but not limited to, DMF, DMSO, methylene chloride, chloroform, 1,2-dichlorethane, THF, toluene, benzene, ether, and hexane.

Conversion of the isocyanates to amino groups may be achieved simply by acid- or base-catalyzed hydrolysis. Suitable acids may include, but are not limited to, organic acids, such as acetic acid, p-toluenesulfonic acid, and trifluoroacetic acid, and inorganic acids, such as, hydrochloric acid, hydrobromic acid, sulfuric acid, and nitric acid. Suitable bases may include, but are not limited to, inorganic bases, such as lithium hydroxide, sodium hydroxide, and potassium hydroxide, and non-nucleophilic organic bases, such as tetramethylammonium hydroxide.

Figure 7:
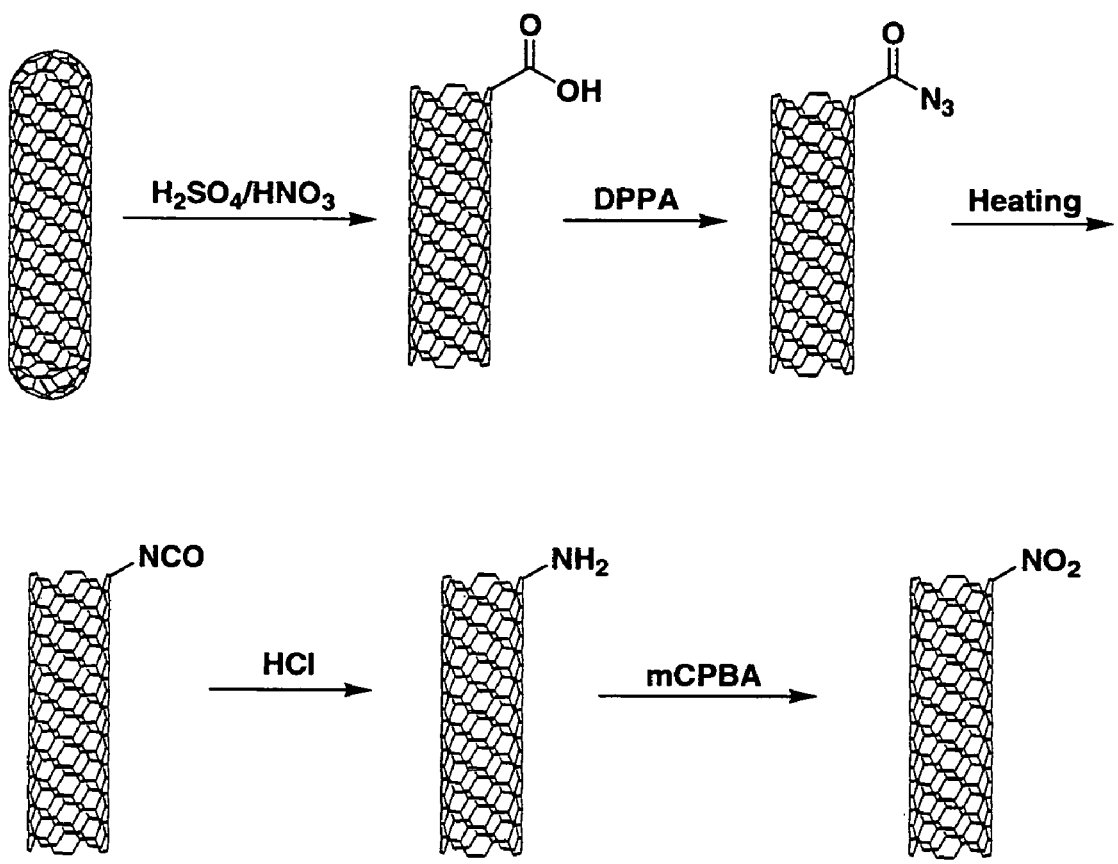
FIG. 7 depicts an exemplary synthesis of a nitro-functionalized SWNT.

In an exemplary embodiment, an amino-functionalized SWNT was prepared from a pristine SWNT as shown in FIG. 7. The SWNT was first oxidized with a mixture of nitric acid and sulfuric acid to introduce carboxyl groups, which are predominantly located on the ends of the SWNT. The carboxylic acids were converted into acyl azides with DPPA in a single step. The acyl azides were refluxed in toluene or dichloroethane to form isocyanates, which were purified by extensively washing the carbon nanotube to remove the reagent and other byproducts and impurities generated during the reaction. This substantially purified isocyanate-functionalized carbon nanotube was characterized by ATR-IR. The isocyanate groups were hydrolyzed with hydrochloric acid to yield amino groups. The amino groups were further oxidized using mCPBA to form nitro groups. As discussed herein, the location of a nitrogen based functional group on the carbon nanotube is determined by the location of the corresponding amine on the starting amino-functionalized carbon nanotube. The nitro groups on the nitro-functionalized SWNT thus produced are, substantially concentrated on the ends of the carbon nanotube.

In another embodiment, the amino-functionalized carbon nanotube may be synthesized from a carboxylic acid functionalized carbon nanotube via amide reduction, in which the carboxyl groups are first converted to amide groups (primary, secondary, or tertiary) via standard amide coupling chemistry and reduced to amines with a reducing reagent.

Figure 8:
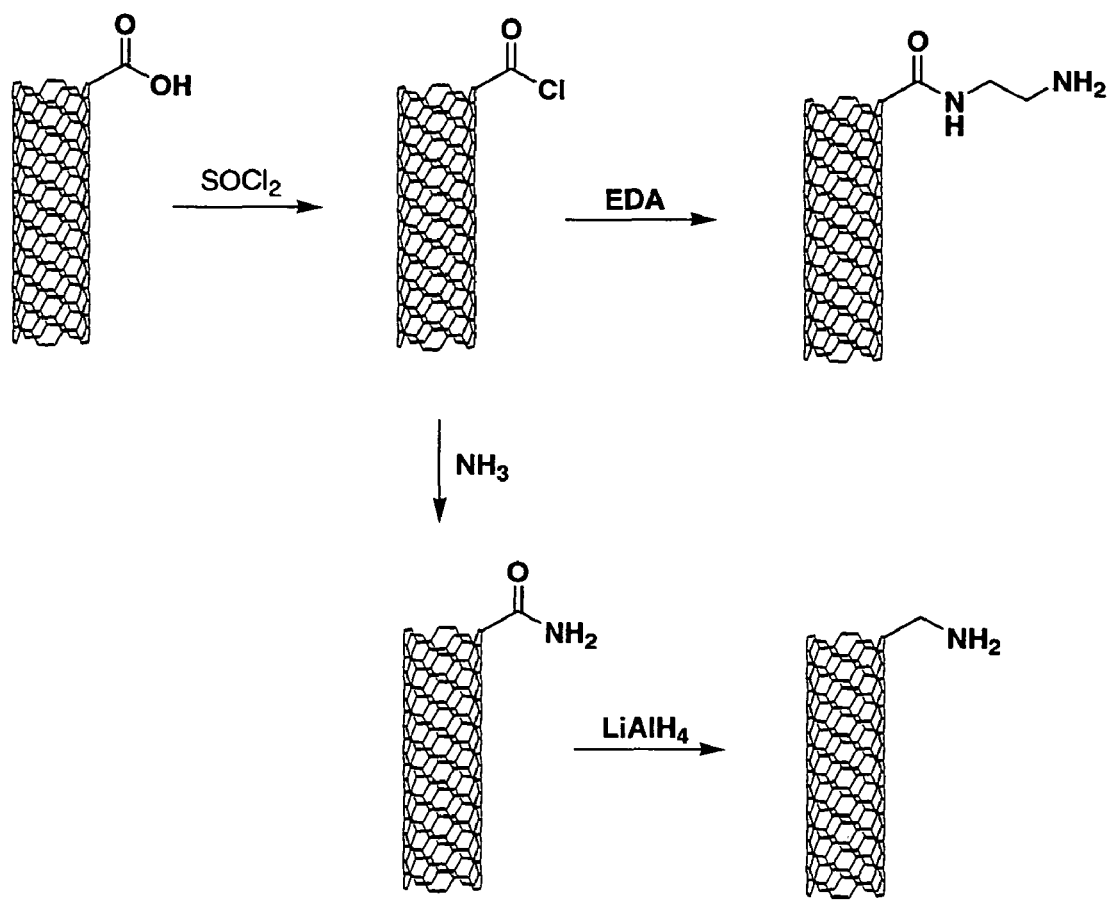
FIG. 8 depicts exemplary syntheses of amino functionalized SWNTs.

In yet another exemplary embodiment, the amino-functionalized carbon nanotube is synthesized from a carboxylic acid functionalized carbon nanotube through the condensation of the carboxylic acid with a compound having two or more amine groups to form an amide linkage with one of these amines (FIG. 8). Suitable amino compounds are diamines, such as, ethylenediamine, propylenediamine, butylenediamine, hexamethylene diamine, 4,4'-methylenebis(cyclohexylamine), and diethyltoluenediamine.

Figure 9:
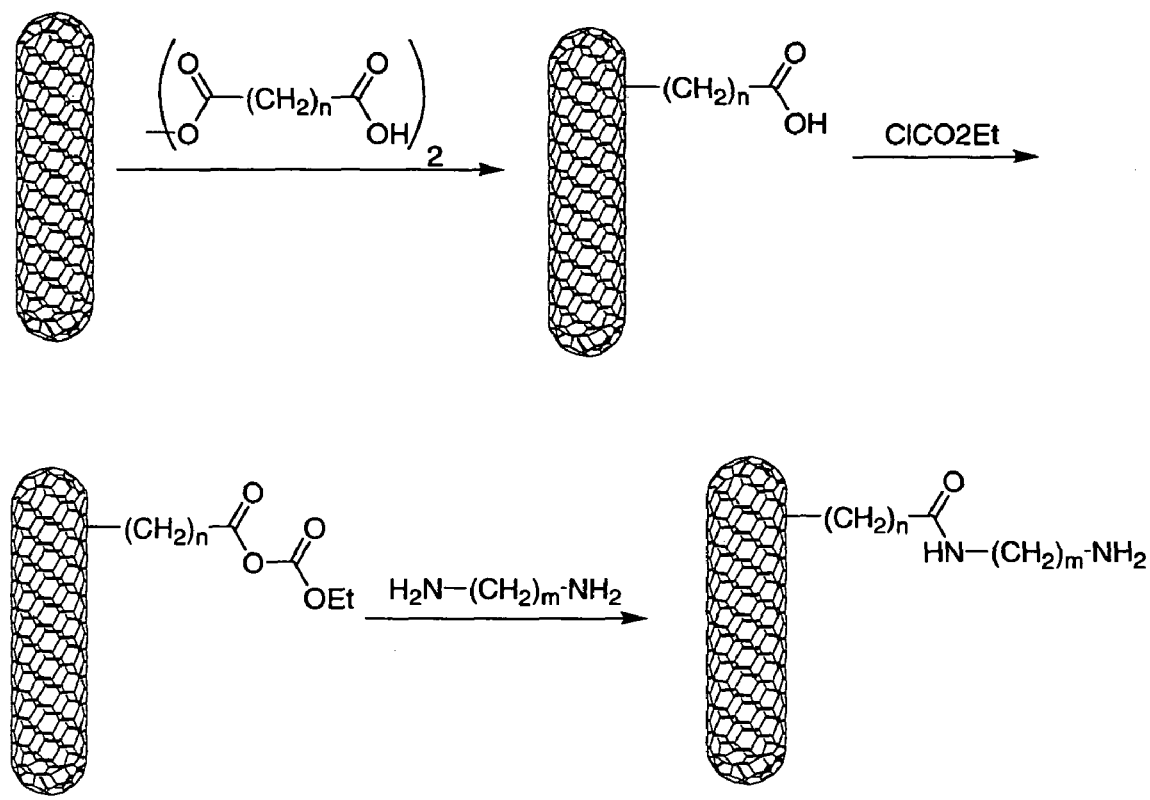
FIG. 9 depicts an exemplary synthesis of an amino functionalized SWNT.

In still another exemplary embodiment, a pristine SWNT is derivatized via free radical addition of alkyl groups terminated with a carboxylic acid. The carboxyalky radical may be thermally produced from dicarboxylic acid acyl peroxides with the structure of (HOOCR$^7$COO—)$_2$, where R$^7$ is C$_{1-10}$ alkylene, C$_{1-10}$ heteroalkylene, C$_{6-10}$ arylene, or C$_{1-6}$ divalent heterocycle (FIG. 9). Using this mild radical chemistry, carboxylic acid is nearly exclusively located on the sidewall of the nanotube. The carboxyl-functionalized SWNT is converted to acyl chlorides by derivatization with thionyl chloride and to amides with a diamine, such as, ethylenediamine. The amino groups may be transformed into nitrogen based functional groups as discussed hereinabove. The nitro groups on the nitro-functionalized SWNT thus produced are substantially concentrated on the sidewall of the carbon nanotube.

EXPERIMENTAL (ACTUAL) EXAMPLES

The single-wall carbon nanotubes used in the following examples were commercially obtained from Carbon Nanotechnologies, Inc. (HiPco SWNTs). All other chemicals were purchased from Acros Chemicals and used as received without further purification. Bath sonication (Cole-Parmer Model 8845-3) and filtration were employed as indicated below. The reaction intermediates and final products were characterized using Attenuated-Total-Reflectance Fourier Transform Infrared Spectroscopy ("ATR-FTIR") (Nicolet Thermo IR100 Spectrometer). The modified nanotubes were heated at 70° C. and placed under vacuum overnight prior to FTIR analysis. Thermogravimetric analysis ("TGA") and differential scanning calorimetry ("DSC") testing were performed on a TA Instrument Model Q1000 and model 2910 with aluminum pan in nitrogen atmosphere at a heating rate of 5° C./min.

Example I

Preparation of Shortened, Carboxylic Acid-Functionalized SWNTs

Following reported procedures (Liu, et al., *Science* 1998, 280:1253; Chen, et al. Science 1998, 282:95; and Holzinger, et al., *Angew. Chem., Int. Ed. Engl.* 2001, 40:4002), the SWNT samples were purified and oxidized by first treating them with 37% hydrochloric acid for 24 h at room temperature to remove any catalyst and support material, then diluted with distilled water and filtered. The SWNTs (100 mg) were sonicated in 40 mL of a mixture of concentrated H$_2$SO$_4$/concentrated HNO$_3$ (3:1, v/v) for 1.5 h. The mixture was diluted with distilled water (500 mL) and filtered. The solid was dried at room temperature and sonicated in a mixture of sulfuric acid/hydrogen peroxide (4:1, v/v) for 10 minutes. The reaction mixture was allowed to stand at room temperature for 1 h. After dilution with 500 mL of deionized water, the mixture was filtered and dried under vacuum at room temperature. The yield of the carboxyl-functionalized SWNTs (70 mg) was approximately 70%. Both the purification process and the shortening process terminate the open ends and sidewall defect sites of the SWNTs with carboxylic acid groups. Using the titration method of Haddon et al. (Hu, et al., *Chem. Phys. Lett.* 2001, 345:25), the number of acidic sites on the purified SWNTs was determined to be approximately 9.6-11%.

Example II

Preparation of SWNT-Acyl Azide

Figure 10:
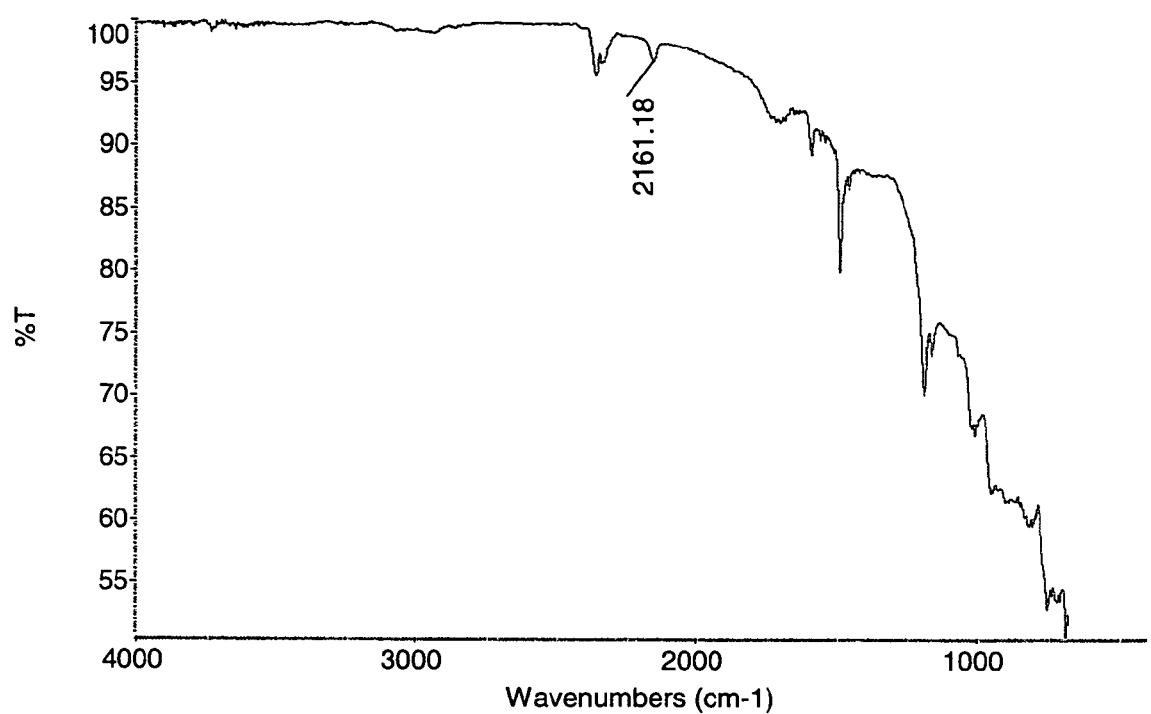
FIG. 10 depicts the ATR-FTIR spectrum of an acyl azide-functionalized SWNT.
Figure 11:
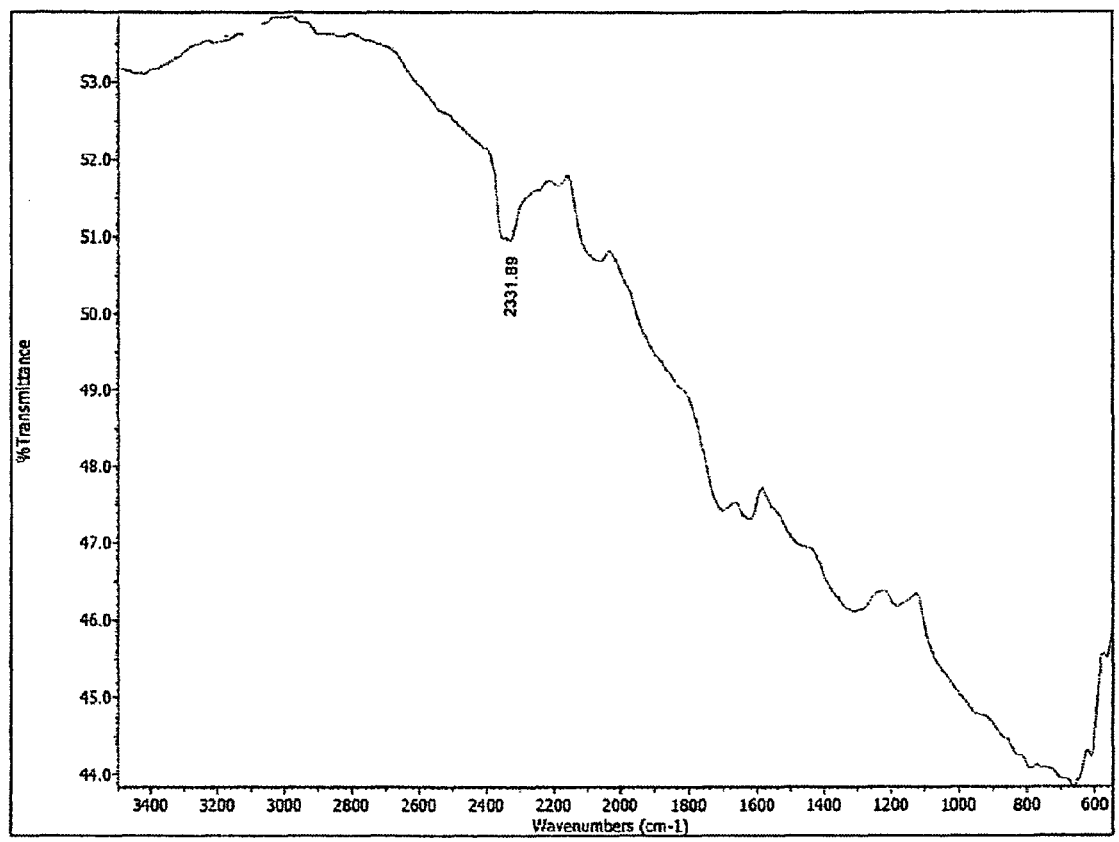
FIG. 11 depicts the ATR-FTIR spectrum of an isocyanate-functionalized SWNT.

The shortened, carboxyl-functionalized SWNTs (135 mg) were placed in a round bottom flask with 10 mL of anhydrous DMF. After the suspension was sonicated for 5 minutes to disperse the SWNTs, diphenylphosphoryl azide ("DPPA", 1.4 mL, d 1.270) was added slowly and the reaction mixture was allowed to react at room temperature overnight (Martinelli and Chaykovsky, *J. Med. Chem.* 1979, 22:874; and DeKimpe, et al., *J. Org. Chem.* 1994, 59: 8215). The reaction mixture was centrifuged for 10 minutes and the DMF solvent was decanted from the black SWNT solid. The SWNT-acyl azide product (130 mg) was dried at room temperature under vacuum for 24 hours. The ATR-FTIR spectrum showed a strong stretch at 2161 cm$^{-1}$ for the newly formed azide moiety (FIG. 10).

Example III

Preparation of SWNT-NCO

A general method for the Curtius Rearrangement was used for the formation of the SWNT-isocyanate by following the general procedures as described in literatures (Yukawa and Tsuno, *J. Am. Chem. Soc.* 1959, 81:2007; and Brady, et al., *J. Mater. Chem.* 1999, 9:2271).

The SWNT-acyl azide (25 mg) was placed in a round bottom flask and dried under vacuum at room temperature for 2 weeks to completely remove any excess DPPA. Toluene (10 mL) was added to the flask and the mixture was sonicated for 3.5 hr. The reaction mixture was heated for 16 h at 100° C. The evolution of nitrogen gas bubbles from the reaction mixture had ceased after the heating. The solution was cooled to room temperature, centrifuged for 10 min and the toluene was decanted from the solid SWNT product. The SWNT-NCO (22 mg) was isolated and dried under vacuum overnight. The ATR-FTIR spectrum show the complete disappearance of the 2161 cm$^{-1}$ stretch for the azide group and a new strong stretch at 2332 cm$^{-1}$.

Example IV

Preparation of SWNT-NH$_2$

Figure 12:
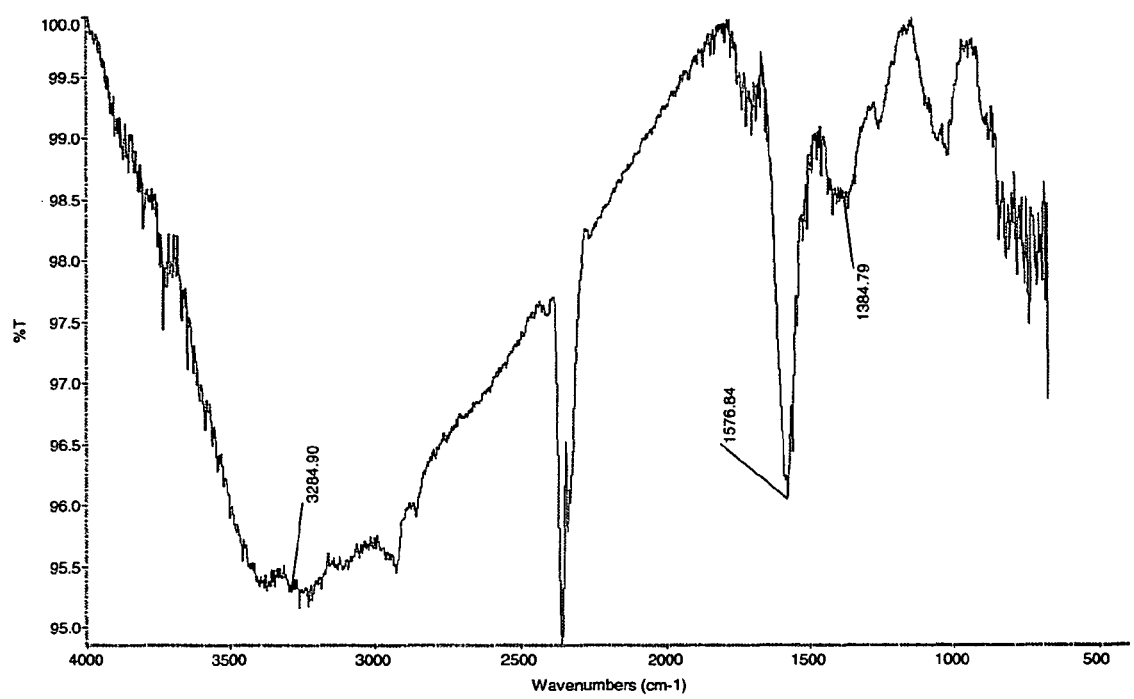
FIG. 12 depicts the ATR-FTIR spectrum of an amino-functionalized SWNT.

The acid-catalyzed hydrolysis of the SWNT-isocyanate was catalyzed using hydrochloric acid. The SWNT-isocyanate (14 mg) was placed in a round bottom flask with 4 mL of 8 N HCl and sonicated for 5 minutes. The reaction mixture was heated at 60° C. for 24 h. A 10 N NaOH solution was added to the reaction mixture until it was basic. The SWNT-NH$_2$ (12 mg) was isolated after centrifugation and washed twice with distilled water and THF then dried under vacuum for 72 h. The ATR-FTIR spectrum showed a strong, broad absorption at about 3285 cm$^{-1}$ for the N—H stretch and an absorption at about 1577 cm$^{-1}$ for the N—H bending, confirming amino group formation (FIG. 12).

Example V

Preparation of SWNT-NO$_2$

The oxidation of the SWNT-NH$_2$ to the SWNT-NO$_2$ followed a procedure analogous to that of Eaton et al. (Eaton, et al., *J. Org. Chem.* 1984, 49:185). The SWNT-NH$_2$ (12 mg) was added to 10 mL anhydrous DMF and sonicated for 10 min to disperse the SWNTs. The SWNT-NH$_2$ mixture was centrifuged and the solid isolated by decanting the DMF. The black solid was placed under vacuum overnight to remove the excess DMF. In a flask, 100 mg meta-chloroperbenzoic acid (m-CPBA) was added to 15 mL anhydrous THF and the solution was refluxed. The dispersed amino-functionalized SWNT was added to the refluxing solution in two 6 mg portions and the reaction mixture was refluxed for 16 h. The reaction mixture was cooled to room temperature and washed with 1 N NaOH and anhydrous THF. The SWNT-NO$_2$ was isolated (12 mg) after drying under vacuum for 24 h. The ATR-FTIR spectrum showed strong stretches at 1565, 1409, and 1054 cm$^{-1}$ for the nitro group formation (FIG. 1).

The examples set forth above are provided to give those of ordinary skill in the art with a complete disclosure and description of how to make and use the exemplary embodiments of the compositions, and are not intended to limit the scope of what the inventors regard as their invention. Modifications of the above-described modes for carrying out the invention that are obvious to persons of skill in the art are intended to be within the scope of the following claims. All publications, patents, and patent applications cited in this specification are incorporated herein by reference as if each such publication, patent or patent application were specifically and individually indicated to be incorporated herein by reference.

Finally, the numerical parameters set forth in the specification and attached claims are approximations (for example, by using the term "about") that may vary depending upon the desired properties sought to be obtained by the present invention. At the very least, and not as an attempt to limit the application of the doctrine of equivalents to the scope of the claims, each numerical parameter should at least be construed in light of the number of significant digits and by applying ordinary rounding.

What is claimed is:

1. A carbon nanotube, comprising a structure of

CNT-Z$_n$, wherein
said CNT is directly attached to said Z via a covalent bond;
said n is from 1 to 1,000;
said CNT is a carbon nanotube with at least two ends and at least one side wall; and
said Z is a nitrogen based functional group, and
wherein an amount of acidic sites on said CNT is in a range of approximately 9.6-11%.

2. The carbon nanotube of claim 1, wherein the carbon nanotube is at least one of a single-walled carbon nanotube, double-walled carbon nanotube, and a multi-walled carbon.

3. The carbon nanotube of claim 1, wherein the carbon nanotube is a single-walled carbon nanotube.

4. The carbon nanotube of claim 1, wherein nitrogen based functional group Z is selected from at least one of nitro, nitroso, N-oxide, oxime, hydroxylamine, diazo, azo, and azide.

5. The carbon nanotube of claim 1, wherein the nitrogen based functional group Z is a nitro moiety.

6. The carbon nanotube of claim 1, wherein at least one said nitrogen based functional group is attached covalently to a lattice carbon of at least one end of the carbon nanotube, directly.

7. The carbon nanotube of claim 1, wherein the carbon nanotube comprises a plurality of nitrogen based functional groups, said plurality of nitrogen based functional groups attached to lattice carbons of the carbon nanotube are concentrated substantially on ends of the carbon nanotube.

8. The carbon nanotube of claim 1, wherein the carbon nanotube comprises a plurality of nitrogen based functional groups, said plurality of nitrogen based functional groups attached to lattice carbons of the carbon nanotube are concentrated substantially on a sidewall of the carbon nanotube.

9. The carbon nanotube of claim 1, wherein the carbon nanotube includes an infrared spectrum with a very strong absorption peak from about 1450 cm$^{-1}$ to about 1620 cm$^{-1}$ and a strong absorption peak from about 1300 cm$^{-1}$ to about 1450 cm$^{-1}$.

10. The carbon nanotube of claim 9, wherein the carbon nanotube includes an infrared spectrum substantially in accordance with FIG. 1.

11. The carbon nanotube of claim 1, wherein the carbon nanotube includes an infrared spectrum with a very strong absorption peak from about 1450 cm$^{-1}$ to about 1620 cm$^{-1}$ and a strong absorption peak from about 1300 cm$^{-1}$ to about 1450 cm$^{-1}$, and
wherein the infrared spectrum further includes an additional strong absorption peak at from about 930 cm$^{-1}$ to about 1200 cm$^{-1}$.

12. The carbon nanotube of claim 1, wherein at least one said nitrogen based functional group is attached covalently to a lattice carbon of at least one end of the carbon nanotube.

13. An isocyanate-functionalized carbon nanotube, comprising a structure of CNT-V$_n$, wherein n is from 1 to 1,000; CNT is a carbon nanotube with at least two ends and at least one side wall; and V is an isocyanate, wherein said V is directly attached to said CNT, wherein said structure is an isolated structure independent from CNT-NH$_2$, wherein the isocyanate-functionalized carbon nanotube comprises an infrared spectrum with a strong absorption peak about 2250 cm$^{-1}$ to about 2450 cm$^{-1}$, and wherein an amount of acid sites on said CNT is in a range of approximately 9.6-11%.

* * * * *